(12) United States Patent
Nakamura

(10) Patent No.: US 11,264,744 B2
(45) Date of Patent: Mar. 1, 2022

(54) CARD-TYPE CONNECTOR HAVING A ROTATABLE COVER CONFIGURED TO BE FASTENED TO THE CIRCUIT BOARD

(71) Applicant: Japan Aviation Electronics Industry, Limited, Tokyo (JP)

(72) Inventor: Tomohiro Nakamura, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 17/104,126

(22) Filed: Nov. 25, 2020

(65) Prior Publication Data

US 2021/0234292 A1 Jul. 29, 2021

(30) Foreign Application Priority Data

Jan. 23, 2020 (JP) .............................. JP2020-008898

(51) Int. Cl.
*H01R 13/447* (2006.01)
*H01R 12/70* (2011.01)
*H05K 5/02* (2006.01)

(52) U.S. Cl.
CPC ....... *H01R 12/7023* (2013.01); *H01R 13/447* (2013.01); *H05K 5/0286* (2013.01)

(58) Field of Classification Search
CPC .. H01R 12/7023; H01R 12/88; H01R 13/447; H05K 5/0286; G06K 13/085
See application file for complete search history.

(56) References Cited

U.S. PATENT DOCUMENTS

| 6,059,588 | A | * | 5/2000 | Tung | ...................... | G06K 13/08 |
| | | | | | | 439/159 |
| 6,062,889 | A | * | 5/2000 | Hyland | ................ | G06K 7/0021 |
| | | | | | | 439/326 |
| 6,623,304 | B2 | | 9/2003 | Harasawa et al. | | |
| 7,066,766 | B2 | | 6/2006 | Harasawa et al. | | |
| 9,270,042 | B2 | | 2/2016 | Naito et al. | | |
| 10,622,738 | B2 | | 4/2020 | Nakamura | | |
| 2014/0148046 | A1 | | 5/2014 | Naito et al. | | |
| 2016/0086000 | A1 | | 3/2016 | Sarraf et al. | | |

FOREIGN PATENT DOCUMENTS

| CN | 1170411 C | 10/2002 |
| CN | 1478315 A | 2/2004 |
| CN | 103229362 A | 7/2013 |
| CN | 204156173 U | 2/2015 |
| JP | 2003-086302 A | 3/2003 |
| JP | 2012-084804 A | 4/2012 |
| TW | 202002429 A | 1/2020 |

OTHER PUBLICATIONS

Taiwanese Office Action in 109142368, dated Sep. 3, 2021, with English translation.

* cited by examiner

*Primary Examiner* — Vanessa Girardi
(74) *Attorney, Agent, or Firm* — Collard & Roe, P.C.

(57) ABSTRACT

A connector is mountable on a circuit board. A card-type device is accommodatable in the connector. The connector comprises a base, a cover and a terminal. The cover is attached to the base to be openable and closable. The terminal is held by the base. The cover has one or more connection portions. The connection portion is directly connected to the circuit board under a close state where the connector is mounted on the circuit board and the cover is closed relative to the base.

6 Claims, 8 Drawing Sheets

CARD-TYPE CONNECTOR HAVING A ROTATABLE COVER CONFIGURED TO BE FASTENED TO THE CIRCUIT BOARD

CROSS REFERENCE TO RELATED APPLICATIONS

This application is based on and claims priority under 35 U.S.C. § 119 to Japanese Patent Application No. JP 2020-008898 filed Jan. 23, 2020, the content of which is incorporated herein in its entirety by reference.

BACKGROUND OF THE INVENTION

This invention relates to a connector which is configured to accommodate a card-type device and is configured to be electrically connected to the card-type device.

For example, this type of connector is disclosed in JP 2003-86302A (Patent Document 1), the content of which is incorporated herein by reference.

Referring to FIGS. 15 and 16, Patent Document 1 discloses a connector 92 which is configured to accommodate a card-type device 98 such as an integrated circuit (IC) card and is configured to be electrically connected to the card-type device 98. The connector 92 comprises a housing (base) 922, a cover 924 and a plurality of signal contacts (terminals) 928. The cover 924 is attached to the base 922 to be openable and closable. In an operation of connecting the card-type device 98 to the connector 92, the card-type device 98 is held by the cover 924 at first, and then the cover 924 is closed. Referring to FIG. 16, when the cover 924 is closed, the card-type device 98 is accommodated in a card-accommodation portion which is an inner space of the connector 92.

When the connector as in Patent Document 1 is used, the card-type device 98 accommodated in the card-accommodation portion generates heat. Since the card-accommodation portion is enclosed by the base and the cover, the heat generated in the card-type device 98 tends to be accumulated in the card-accommodation portion.

SUMMARY OF THE INVENTION

It is therefore an object of the present invention to provide a connector which can effectively discharge the heat generated in the card-type device to the outside of the connector.

The connector as in Patent Document 1 is mounted on a circuit board when used. When the connector is used, its terminals are fixed on conductive pads of the circuit board, and its base is fixed to the circuit board, for example, via frames provided in the base. These terminals and frames work as heat transmission paths which transmit the heat generated in the card-type device to the circuit board. In addition, the heat generated in the card-type device is radiated into the air through the cover.

The inventor of the present invention has found out that there is an instance in which the heat generated in the card-type device cannot be sufficiently discharged to the outside even when the aforementioned mechanism is provided. As a solution to such a problem, the inventor of the present invention has conceived to make the cover work as a heat transmission path to the circuit board in addition to the terminals and the frames. More specifically, if the cover, which is attached to the base to be openable and closable, is directly connected to the circuit board, an efficient heat transmission path will be formed. The present invention provides the connector described below based on the aforementioned conception.

An aspect of the present invention provides a connector which is mountable on a circuit board and in which a card-type device is accommodatable. The connector comprises a base, a cover and a terminal. The cover is attached to the base to be openable and closable. The terminal is held by the base. The cover has one or more connection portions. The connection portion is directly connected to the circuit board under a close state where the connector is mounted on the circuit board and the cover is closed relative to the base.

The cover of the connector according to an aspect of the present invention is attached to the base to be openable and closable. When the cover is closed under a state where the card-type device is accommodated in the connector, the card-type device is covered by the cover. According to an aspect of the present invention, the cover covering the card-type device is directly connected to the circuit board and thereby works as an efficient heat transmission path which transmits the heat generated in the card-type device to the circuit board. Thus, an aspect of the present invention provides a connector which can effectively discharge the heat generated in the card-type device to the outside of the connector.

An appreciation of the objectives of the present invention and a more complete understanding of its structure may be had by studying the following description of the preferred embodiment and by referring to the accompanying drawings.

Figure 1:
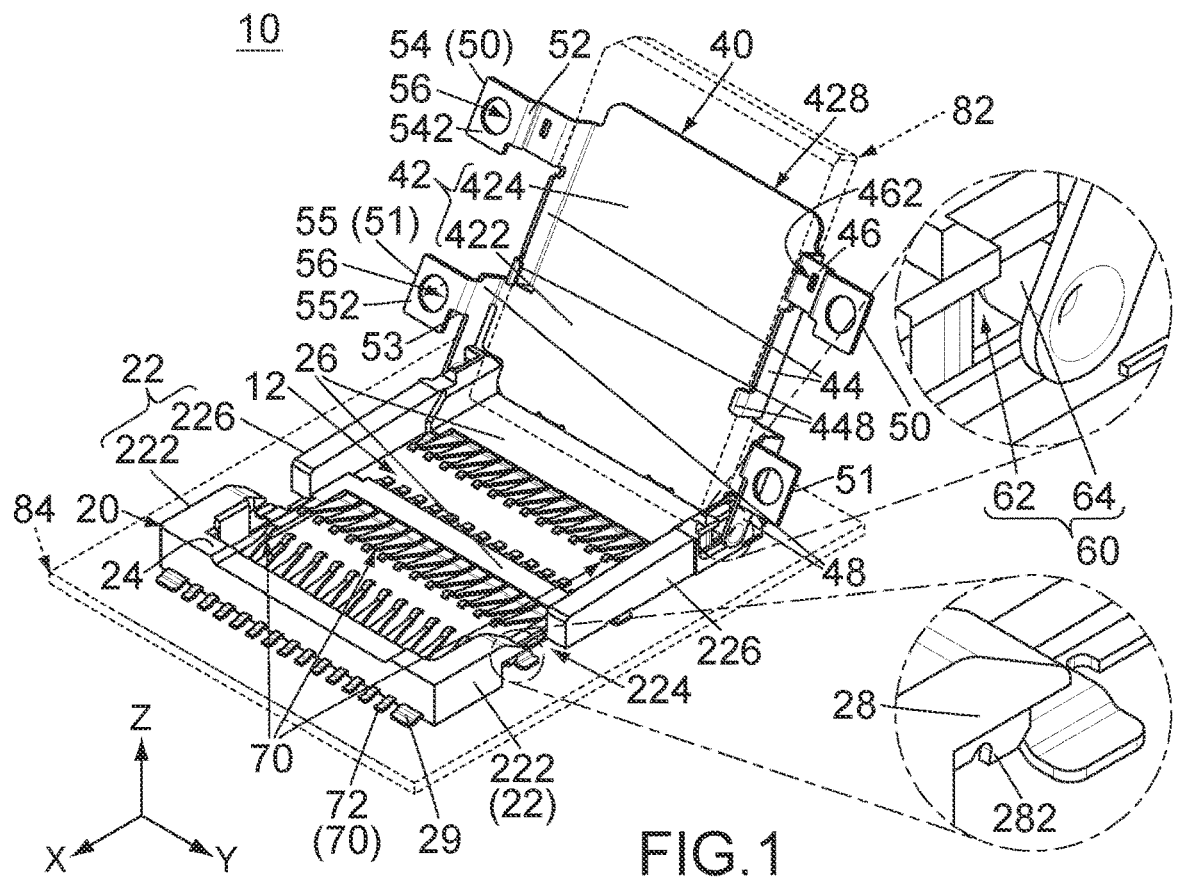
FIG. 1 is a perspective view showing a connector according to an embodiment of the present invention, wherein a cover of the connector is located at an open position, an outline of a card-type device and an outline of a part of a circuit board are illustrated with dashed line, and two parts of the connector each enclosed by chain dotted lines are enlarged and illustrated.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Figure 8:
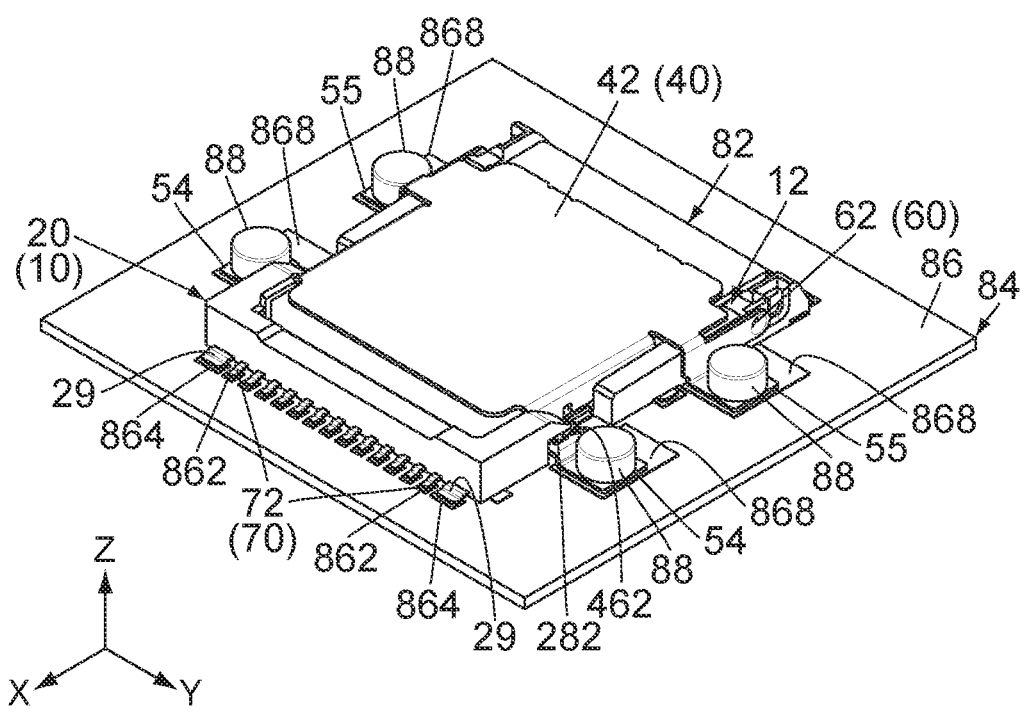
FIG. 8 is another perspective view showing the connector of FIG. 4, wherein the connector accommodates the card-type device, and connection portions of the cover are screwed to the circuit board.

Referring to FIGS. 1 and 8, a connector 10 of an embodiment of the present invention is mountable on a circuit board 84 provided in an electronic device (not shown), and a card-type device 82 is accommodatable in the connector 10. The connector 10 of the present embodiment is a card connector which electrically connects the card-type device 82 with the electronic device. However, the present invention is not limited thereto but is applicable to various card connectors.

The card-type device 82 of the present embodiment is an unitary card which is formed with a plurality of electrodes (not shown). However, the present invention is not limited thereto. For example, the card-type device 82 may include a card and a tray (not shown) on which the card is mounted.

Referring to FIG. 8, the circuit board 84 of the present embodiment has a mounting surface 86 on which the connector 10 is mountable. The mounting surface 86 is formed with a plurality of conductive pads 862 and 864 and four fixing portions 868 each made of conductor. In addition, the circuit board 84 is formed with four screw holes (not shown) which correspond to the fixing portions 868, respectively. Each of the screw holes passes through the corresponding fixing portion 868. The circuit board 84 of the present embodiment has the structure described above. However, the present invention is not limited thereto, but the structure of the circuit board 84 can be modified in accordance with the structure of the connector 10.

Figure 2:
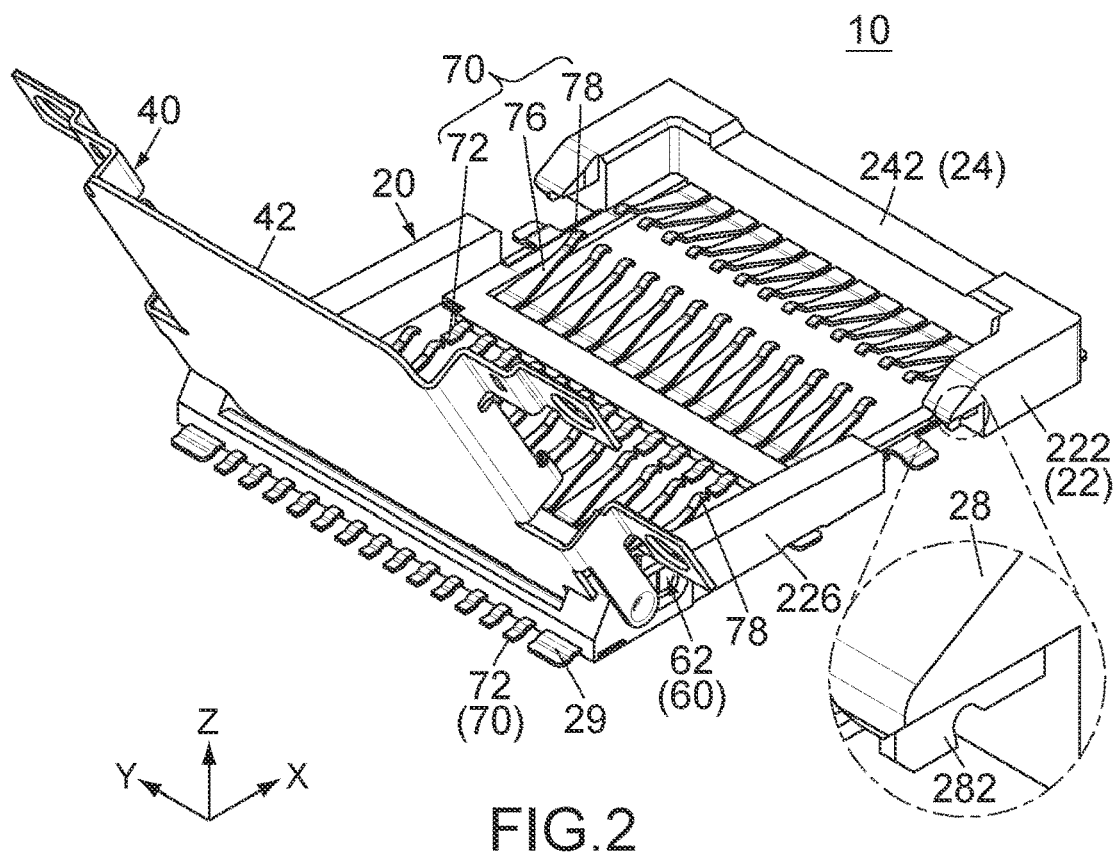
FIG. 2 is another perspective view showing the connector of FIG. 1, wherein a part of the connector enclosed by chain dotted lines is enlarged and illustrated.

Referring to FIGS. 1 and 2, the connector 10 of the present embodiment comprises a base 20, a cover 40 made of metal and a plurality of terminals 70 each made of conductor. The base 20 of the present embodiment comprise a body made of insulator such as resin and a plurality of frames 29 each of which is made of metal and is insert-molded in the body. However, the present invention is not limited thereto, but the frames 29 may be provided as necessary. Hereafter, explanation will be made about the structure of each of the base 20, the terminals 70 and the cover 40 of the present embodiment.

Figure 3:
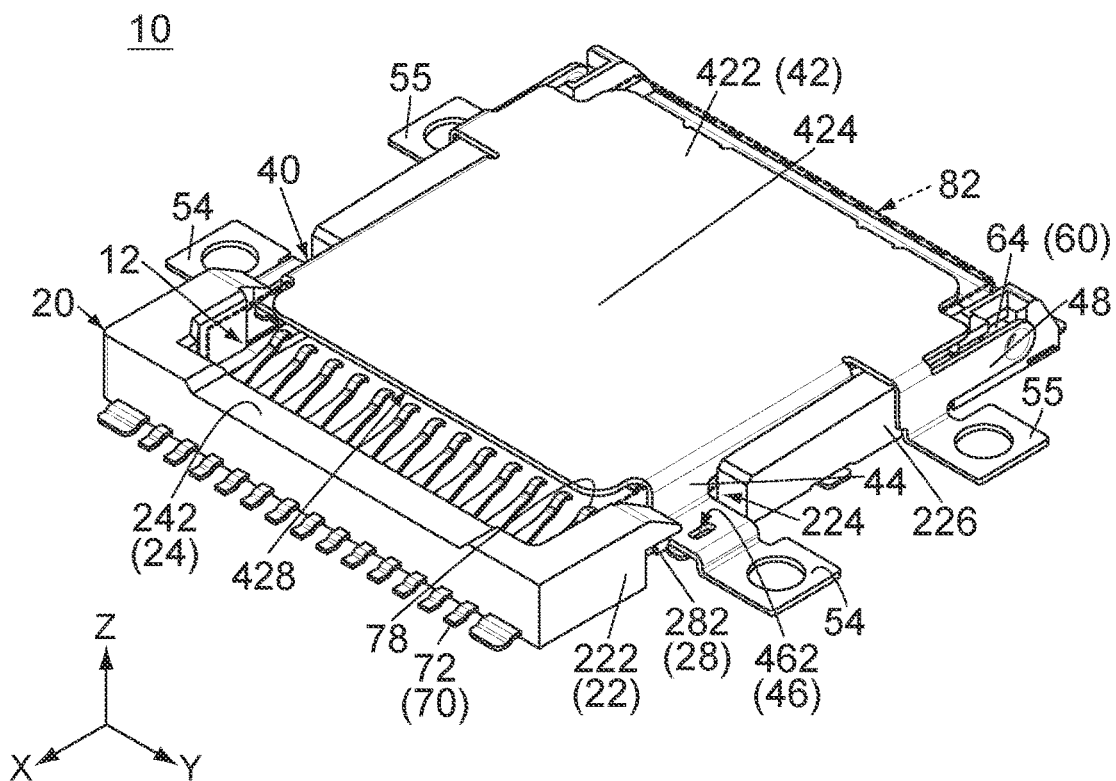
FIG. 3 is a perspective view showing the connector of FIG. 1, wherein the cover is located at an intermediate position, and an outline of a part of the card-type device is illustrated with dashed line.

As shown in FIG. 1, the base 20 of the present embodiment has two sidewalls 22, a front wall 24 and a bottom portion 26. Referring to FIGS. 1 and 3, the base 20 is formed with a card-accommodation portion 12 in which the card-type device 82 is accommodatable. The card-accommodation portion 12 of the present embodiment is a space which is enclosed by the sidewalls 22, the front wall 24 and the bottom portion 26 of the base 20.

Referring to FIG. 1, the sidewalls 22 are located at opposite sides of the base 20 in a pitch direction (Y-direction), respectively, and extend in parallel to each other along a front-rear direction (X-direction) perpendicular to the Y-direction. Each of the sidewalls 22 is formed with a cutout portion 224 so that the sidewall 22 is separated into two parts, namely a front portion 222 and a rear portion 226. Each of the front portions 222 is a front part (positive X-side part) of the sidewall 22. Each of the rear portions 226 is a rear part (negative X-side part) of the sidewall 22.

The front wall 24 is located at a front end (positive X-side end) of the base 20. The front wall 24 extends along the Y-direction and couples front ends of the front portions 222 to each other. The front wall 24 is formed with a recessed portion 242. The recessed portion 242 is located at the middle of the front wall 24 in the Y-direction. The recessed portion 242 is recessed downward, or in the negative Z-direction, in an upper-lower direction (Z-direction) perpendicular to both the X-direction and the Y-direction.

The bottom portion 26 is located at a lower end (negative Z-side end) of the base 20. The bottom portion 26 extends along a horizontal plane (XY-plane) perpendicular to the Z-direction. The bottom portion 26 is formed with two holes which pass through the most part of the bottom portion 26 in the Z-direction.

The base 20 of the present embodiment has the structure described above. However, the structure of the base 20 of the present invention is not limited to the structure described above, provided that the connector 10 is formed with the card-accommodation portion 12. For example, the cutout portions 224 and the recessed portion 242 may be provided as necessary.

Referring to FIGS. 1 and 2, the terminals 70 of the present embodiment are insert-molded in the base 20 to be held by the base 20. In detail, the terminals 70 are divided into three rows in the X-direction. The terminals 70 of each row are arranged in the Y-direction. However, the number and the arrangement of the terminals 70 of the present invention are not specifically limited. Moreover, the terminals 70 may be held by the base 20 in any manner.

The terminals 70 of the present embodiment have structures similar to each other. Each of the terminals 70 is a single metal plate with bends and has a fixed portion 72, a spring portion 76 and a contact portion 78. Referring to FIG. 8, each of the fixed portions 72 is fixed on and connected to the conductive pad 862 of the circuit board 84 via soldering, etc. when the connector 10 is mounted on the circuit board 84. Referring to FIG. 2, each of the spring portions 76 extends in the X-direction from a part of the terminal 70 held by the base 20 and is resiliently deformable. Each of the contact portions 78 is supported by the spring portion 76 and is movable in the Z-direction in accordance with resilient deformation of the spring portion 76. Each of the contact portions 78 is located at an upper end (positive Z-side end) of the terminal 70 when the spring portion 76 is not resiliently deformed. Each of the terminals 70 of the present embodiment has the structure described above. However, the structure of the terminal 70 of the present invention is not specifically limited.

Referring to FIGS. 1 and 3, the cover 40 of the present embodiment is formed by bending a single metal plate and has a cover body 42, two card-holding portions 44 and two axis-support portions 48.

The cover body 42 of the present embodiment is a flat plate-like metal plate and extends along an intersection plane in parallel to the Y-direction. The intersection plane is oblique to the Z-direction when the cover 40 is in a position shown in FIG. 1 and is perpendicular to the Z-direction when the cover 40 is in another position shown in FIG. 3. The cover body 42 has a base portion 422 of a rectangular shape and an extension portion 424 of another rectangular shape. The extension portion 424 illustrated in FIG. 1 is located upward of, or at the positive Z-side of, the base portion 422 and has an end 428 which is located at an upper end of the cover body 42. The extension portion 424 illustrated in FIG. 3 is located forward of, or at the positive X-side of, the base portion 422, so that the end 428 is located at a front end of the cover body 42.

Each of the card-holding portions 44 is a flat plate-like metal piece which is bent to be perpendicular to the Y-direction. The card-holding portions 44 are connected to opposite edges of the extension portion 424 of the cover body 42 in the Y-direction, respectively. Each of the card-holding portions 44 extends along an intersection direction perpendicular to the Y-direction. The intersection direction is oblique to the Z-direction when the cover 40 is in the position shown in FIG. 1 and is perpendicular to the Z-direction when the cover 40 is in the position shown in FIG. 3. As shown in FIG. 1, each of the card-holding portions 44 is provided with a holding projection 448. Each of the holding projections 448 projects inward in the Y-direction from the card-holding portion 44. The two card-holding portions 44 which are formed as described above can sandwich and hold the card-type device 82 in the Y-direction.

Each of the axis-support portions 48 is a flat plate-like metal piece which is bent to be perpendicular to the Y-direction. The axis-support portions 48 are partially connected to opposite edges of the base portion 422 of the cover body 42 in the Y-direction, respectively. Each of the axis-support portions 48 extends along the intersection direction.

The cover 40 of the present embodiment has the structure described above. However, the structure of the cover 40 of the present invention is not limited to the structure described above. For example, the holding projections 448 may be provided as necessary.

Figure 4:
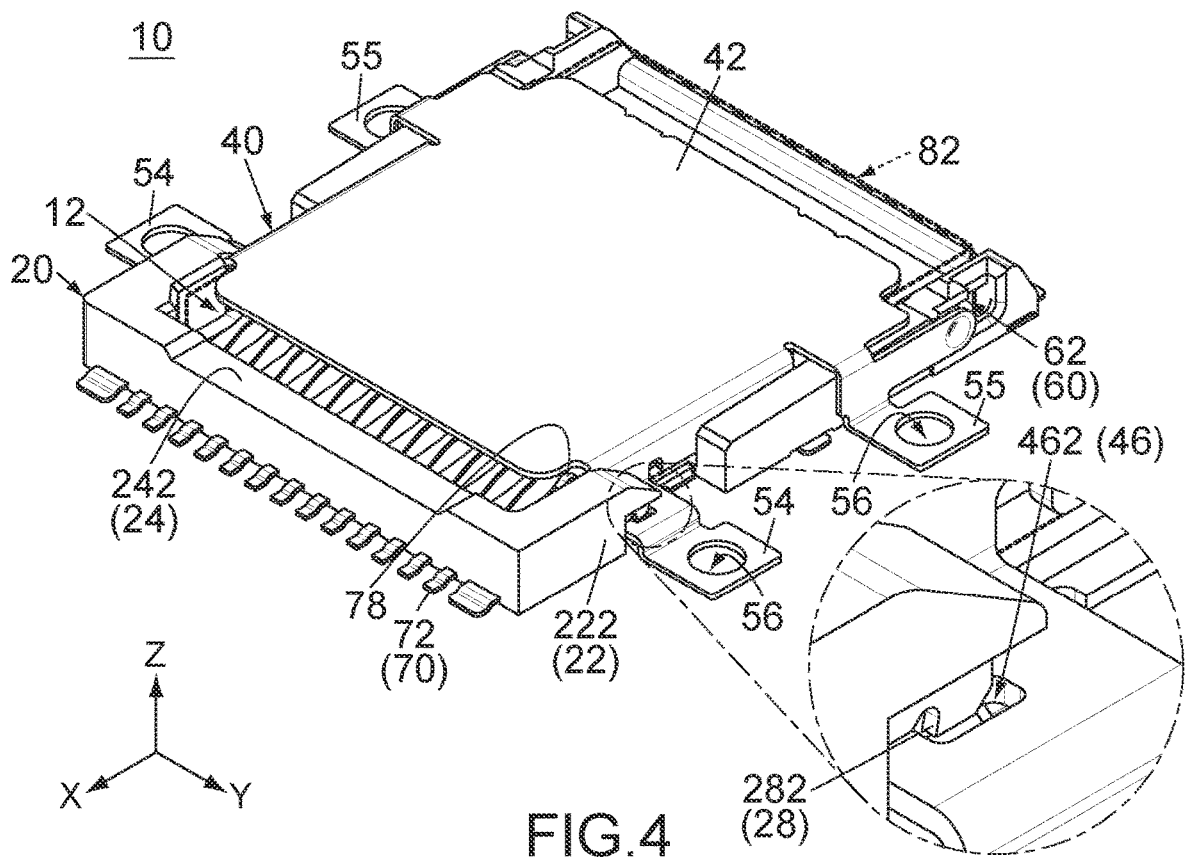
FIG. 4 is a perspective view showing the connector of FIG. 3, wherein the cover is located at a close position, an outline of a part of the card-type device is illustrated with dashed line, and a part of the connector enclosed by chain dotted lines is enlarged and illustrated.

Referring to FIGS. 1, 3 and 4, the connector 10 of the present embodiment has an open/close mechanism. The open/close mechanism supports the cover 40 so that the cover 40 is openable and closable relative to the base 20. Hereafter, explanation will be made about the open/close mechanism of the present embodiment.

Referring to FIGS. 1 and 2, the base 20 of the present embodiment has two bearing portions 62. The bearing portions 62 of the present embodiment are recesses which are formed in the rear portions 226 of the two sidewalls 22, respectively. Each of the bearing portions 62 is located in the vicinity of a rear end (negative X-side end) of the rear portion 226. Each of the bearing portions 62 is recessed inward in the Y-direction and opens outward in the Y-direction. Each of the bearing portions 62 extends in a predetermined range along the X-direction.

Referring to FIGS. 1 and 3, the cover 40 of the present embodiment has two axis portions 64 which correspond to the bearing portions 62 of the base 20, respectively. The axis portions 64 of the present embodiment are projections which are provided on the axis-support portions 48, respectively. Each of the axis portions 64 is located at one of opposite ends of the axis-support portion 48 in the intersection direction, which is farther from the end 428 than the other of the opposite ends is. The intersection direction is oblique to the Z-direction in FIG. 1 and is perpendicular to the Z-direction in FIG. 3. Each of the axis portions 64 projects inward in the Y-direction from the axis-support portion 48.

Each of the axis portions 64 is inserted in the corresponding bearing portion 62, so that the cover 40 is attached to the base 20 to be openable and closable. More specifically, the cover 40 is rotatable about the axis portions 64 relative to the base 20. In addition, the cover 40 is slidable along the X-direction relative to the base 20 in accordance with a movement of the axis portions 64 along the bearing portions 62 within the predetermined range. Thus, the connector 10 comprises a hinge mechanism 60 (open/close mechanism) which allows the cover 40 to be moved relative to the base 20.

Referring to FIGS. 1 to 4, the cover 40 of the present embodiment is attached to the base 20 via the hinge mechanism 60 as described above. The cover 40 of the present embodiment is movable relative to the base 20 between an open position of FIGS. 1 and 2 and a close position of FIG. 4 via an intermediate position of FIG. 3, the open position being a position at which the cover 40 is opened relative to the base 20, the close position being another position at which the cover 40 is closed relative to the base 20.

When the cover 40 is located at the open position of FIGS. 1 and 2, the card-accommodation portion 12 is exposed upward in the Z-direction. When the cover 40, which is located at the open position, is turned down toward the base 20, the cover 40 is located at the intermediate position of FIG. 3. When the cover 40 is located at the intermediate position, the cover body 42 is located over the card-accommodation portion 12 and extends in parallel to the XY-plane. When the cover 40, which is located at the intermediate position, is made to slide forward, the cover 40 is moved to the close position of FIG. 4. Referring to FIG. 4, when the cover 40 of the present embodiment is located at the close position, the cover body 42 partially covers the card-accommodation portion 12 from above. However, the present invention is not limited thereto. For example, when the cover 40 is located at the close position, the cover body 42 may entirely cover the card-accommodation portion 12 from above.

As described above, the cover 40 according to the present embodiment is moved between the open position and the close position via the intermediate position. However, the present invention is not limited thereto. For example, the cover 40, which is located at the open position, may be directly moved to the close position only by turning down the cover 40 toward the base 20. Instead, the cover 40, which is located at the open position, may be directly moved to the close position only by making the cover 40 slide relative to the base 20.

The hinge mechanism 60 of the present embodiment is formed of the two axis portions 64 of the cover 40 and the two bearing portions 62 of the base 20. However, the present invention is not limited thereto, but the structure of the hinge mechanism 60 can be variously modified. Moreover, the open/close mechanism of the present invention is not limited to the hinge mechanism 60.

The connector 10 of the present embodiment has a lock mechanism which can keep the cover 40 at the close position. In particular, the lock mechanism of the present embodiment keeps the cover 40 at the close position when the cover 40 with the card-type device 82 held by the card-holding portions 44 is moved to the close position. Hereafter, explanation will be made about the lock mechanism of the present embodiment.

Referring to FIGS. 1 and 2, the base 20 of the present embodiment has two lock portions 28. The lock portions 28 are provided on the front portions 222 of the sidewalls 22, respectively. Each of the lock portions 28 is a part of the sidewall 22 and protrudes rearward, or in the negative X-direction, from an upper end of the front portion 222. Each of the lock portions 28 has a lower surface (negative Z-side surface) provided with an engagement projection 282. Each of the engagement projections 282 projects downward from the lower surface of the lock portion 28.

Referring to FIGS. 1 and 3, the cover 40 of the present embodiment has two locked portions 46 which correspond to the lock portions 28 of the base 20, respectively. The locked portions 46 are provided on the card-holding portions 44, respectively. Each of the locked portions 46 is provided on one of opposite ends of the card-holding portion 44 in the intersection direction, which is nearer to the end 428 than the other of the opposite ends is. The intersection direction is oblique to the Z-direction in FIG. 1 and is perpendicular to the Z-direction in FIG. 3. Each of the locked portions 46 extends outward in the Y-direction from the card-holding portion 44. Each of the locked portions 46 is formed with an engagement hole 462. Each of the engagement holes 462 passes through the locked portion 46 in a direction perpendicular to the intersection direction.

Referring to FIGS. 1, 3 and 4, when the cover 40, which is located at the open position of FIG. 1 and holds the card-type device 82, is moved toward the intermediate position of FIG. 3, the locked portions 46 of the cover 40 pass through the cutout portions 224 of the sidewalls 22 of the base 20, respectively, to be located at lower ends of the cutout portions 224, respectively. Meanwhile, the card-type device 82 is brought into contact with the contact portions 78 of the terminals 70 and receive an upward spring force from the terminals 70. As a result, the cover 40 receives the upward spring force via the card-type device 82.

When the cover 40 located at the intermediate position is applied with a force directed to the close position of FIG. 4 together with a downward force, a front end of each of the locked portions 46 passes under the corresponding engagement projection 282 and is moved to be forward of the corresponding engagement projection 282. When the force applied to the cover 40 is released from the cover 40 which is moved to the close position, the cover 40 holding the card-type device 82 is moved upward by the spring force of the terminals 70. As a result, each of the engagement projections 282 is securely engaged with the corresponding engagement hole 462.

According to the present embodiment, when the cover 40 holding the card-type device 82 is located at the close position, each of the lock portions 28 locks the corresponding locked portion 46. Thus, the connector 10 of the present embodiment has the lock mechanism which can keep the cover 40 at the close position. The lock mechanism of the present embodiment is formed of the two lock portions 28 each having the engagement projection 282 and the two locked portions 46 each having the engagement hole 462. However, the present invention is not limited thereto, but the structure of the lock mechanism can be variously modified.

For example, the lock mechanism may have a structure which can keep the cover 40 at the close position regardless of whether the cover 40 holds the card-type device 82 or not. Moreover, the lock mechanism may be provided as necessary.

Referring to FIG. 8, the connector 10 of the present embodiment has a heat-discharge mechanism which discharges the heat generated in the card-type device 82 to the outside. Hereafter, explanation will be made about the heat-discharge mechanism of the present embodiment.

Referring to FIGS. 1, 2 and 8, when the cover 40 holding the card-type device 82 is moved from the open position of FIGS. 1 and 2 to the close position of FIG. 8 while the connector 10 is under a mounted state where the connector 10 is mounted on the circuit board 84, the card-type device 82 is accommodated in the card-accommodation portion 12. The state of the connector 10 at that time is referred to as "close state". When the connector 10 is under the close state, the card-type device 82 is pushed upward by the spring force of the terminals 70 to be pressed against the cover 40. Thus, the card-type device 82 is vertically sandwiched between the cover 40 and the contact portions 78 of the terminals 70. Meanwhile, the electrodes (not shown) of the card-type device 82 are brought into the contact portions 78 of the terminals 70, respectively, and the card-type device 82 is electrically connected with the electronic device (not shown) via the terminals 70 connected to the circuit board 84.

The card-type device 82 usually generates heat when connected to the electronic device (not shown). Moreover, when the cover 40 is located at the close position, the card-accommodation portion 12 is enclosed by the base 20 and the cover 40. Therefore, the heat generated in the card-type device 82 tends to be accumulated in the card-accommodation portion 12.

Referring to FIG. 8, according to the present embodiment, the fixed portions 72 of the terminals 70 are fixed to the circuit board 84 having a large heat capacity and thereby work as heat transmission paths which transmit the heat generated in the card-type device 82 to the circuit board 84. The frames 29 embedded in the base 20 are fixed to the conductive pads 864 of the circuit board 84 and thereby similarly work as heat transmission paths. In addition, the cover 40 made of metal has high thermal conductivity. Since the card-type device 82 is in direct contact with the cover 40, the heat generated in the card-type device 82 is radiated into the air through the cover 40.

However, in an instance where the amount of the heat generated in the card-type device 82 is large, the heat generated in the card-type device 82 is sometimes insufficiently discharged outward even when the heat-discharge mechanism described above is provided. As describe below, the cover 40 of the present embodiment works as an efficient heat transmission path to the circuit board 84 even in this instance.

Referring to FIG. 1, the cover 40 of the present embodiment has two heat-transmission portions 50 and two heat-transmission portions 51 in addition to the previously described various portions. The heat-transmission portions 50 are provided on the two locked portions 46, respectively. The heat-transmission portions 51 are provided on the two axis-support portions 48, respectively.

Each of the heat-transmission portions 50 has a coupling portion 52 and a connection portion 54. Each of the coupling portions 52 is connected to the locked portion 46. Each of the connection portions 54 is connected to the coupling portion 52. Thus, each of the coupling portions 52 couples the locked portion 46 and the connection portion 54 to each other. Each of the connection portions 54 is a metal piece having a rectangular shape and extends in parallel to the cover body 42.

Figure 6:
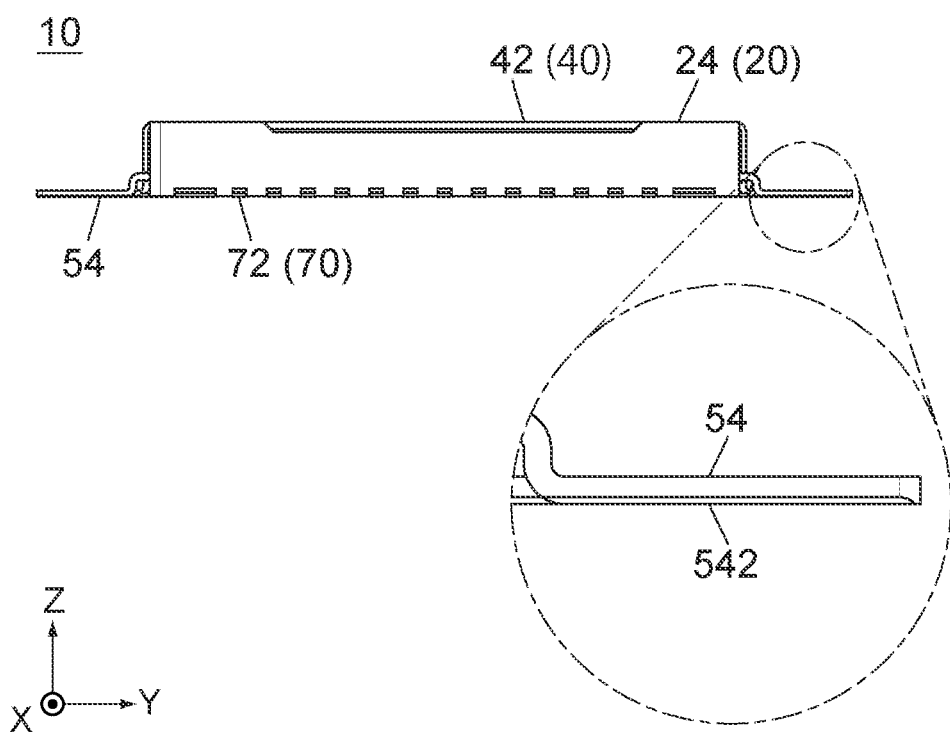
FIG. 6 is a front view showing the connector of FIG. 4, wherein a part of the connector enclosed by chain dotted lines is enlarged and illustrated.

Referring to FIGS. 1 and 6, each of the connection portions 54 has a connection surface 542. Each of the connection surfaces 542 extends in parallel to the cover body 42. Referring to FIGS. 1 and 4, each of the connection portions 54 is formed with a passing hole 56. Each of the passing holes 56 passes through the connection portion 54. Thus, each of the passing holes 56 passes through the connection surface 542. When the cover 40 is located at the close position, each of the connection surfaces 542 is a lower surface of the connection portion 54 and extends substantially in parallel to the XY-plane. Meanwhile, each of the passing holes 56 passes through the connection surface 542 in the Z-direction.

Referring to FIG. 1, each of the heat-transmission portions 51 has a coupling portion 53 and a connection portion 55. Each of the coupling portions 53 is connected to the axis-support portion 48. Each of the connection portions 55 is connected to the coupling portion 53. Thus, each of the coupling portions 53 couples the axis-support portion 48 and the connection portion 55 to each other. Each of the connection portions 55 is a metal piece having a rectangular shape and extends in parallel to the cover body 42.

Figure 7:
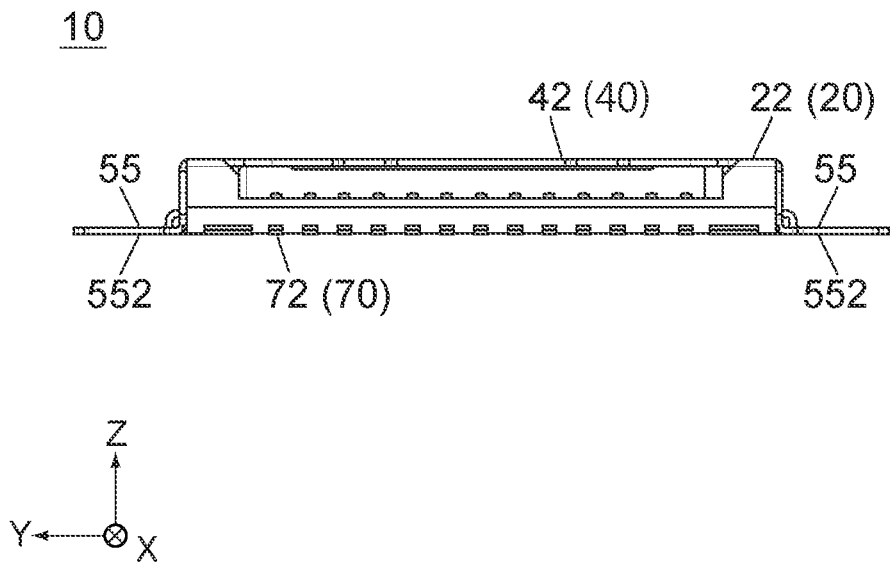
FIG. 7 is a rear view showing the connector of FIG. 4.

Referring to FIGS. 1 and 7, each of the connection portions 55 has a connection surface 552. Each of the connection surfaces 552 extends in parallel to the cover body 42. Referring to FIGS. 1 and 4, each of the connection portions 55 is formed with the passing hole 56. Each of the passing holes 56 passes through the connection portion 55. Thus, each of the passing holes 56 passes through the connection surface 552. When the cover 40 is located at the close position, each of the connection surfaces 552 is a lower surface of the connection portion 55 and extends substantially in parallel to the XY-plane. Meanwhile, each of the passing holes 56 passes through the connection surface 552 in the Z-direction.

Referring to FIG. 8, the cover 40 of the present embodiment is fixed on the circuit board 84 as described below under the close state where the connector 10 is mounted on the circuit board 84 and the cover 40 is closed relative to the base 20.

First, when the cover 40 holding the card-type device 82 is closed or is moved to the close position, the card-type device 82 is covered by the cover 40 from above. When the cover 40 is moved to the close position, the connection portions 54 and 55 are brought into abutment with the fixing portions 868 of the circuit board 84, respectively, or face the fixing portions 868 in the Z-direction with slight distances therebetween, respectively. At that time, the passing holes 56 of the connection portions 54 and 55 are located just over the screw holes (not shown) formed in the circuit board 84, respectively.

Then, four screws 88 are screwed into the screw holes (not shown) of the circuit board 84 through the passing holes 56 of the connection portions 54 and 55 so that the connection portions 54 and 55 are fixed on the fixing portions 868, respectively. Meanwhile, the connection surfaces 542 and 552 (see FIG. 1) of the connection portions 54 and 55 are pressed against the fixing portions 868, respectively. As described above, the connection portions 54 and 55 of the present embodiment are directly connected to the circuit board 84 under the close state. According to the present embodiment, the cover 40 covering the card-type device 82 is directly connected to the circuit board 84 and thereby works as an efficient heat transmission path which transmits the heat generated in the card-type device 82 to the circuit board 84. Thus, the present embodiment provides the connector 10 which can effectively discharge the heat generated in the card-type device 82 to the outside of the connector 10.

According to the present embodiment, the cover 40 is formed of a metal plate and has high thermal conductivity. However, the present invention is not limited thereto, but the cover 40 may be made of any material, provided that heat can be effectively transmitted from the card-type device 82 to the circuit board 84.

According to the present embodiment, each of the connection surfaces 542 and 552 of the connection portions 54 and 55 is in contact with the fixing portions 868 of the circuit board 84 each made of conductor under the close state. This structure improves heat transmission rate from the cover 40 to the circuit board 84. However, the present invention is not limited thereto. For example, each of the connection surfaces 542 and 552 under the close state may be in contact with the circuit board 84 via conductive adhesive. Thus, the fixing portions 868 of the circuit board 84 may be provided as necessary.

According to the present embodiment, each of the connection surfaces 542 and 552 of the connection portions 54 and 55 is in surface contact with the circuit board 84 under the close state. This structure improves the heat transmission rate from the cover 40 to the circuit board 84. However, the present invention is not limited thereto, but each of the connection surfaces 542 and 552 under the close state may be in point contact or in line contact with the circuit board 84.

According to the present embodiment, each of the connection portions 54 and 55 is screwed to the circuit board 84 under the close state. This structure securely forms the heat transmission path from the cover 40 to the circuit board 84. However, the present invention is not limited thereto. For example, each of the connection portions 54 and 55 under the close state may be in direct contact with the circuit board 84 by a spring force. In this modification, each of the connection portions 54 and 55 does not need to be provided with the passing hole 56.

Each of the locked portions 46 of the present embodiment is provided with the connection portion 54. When the cover 40 holding the card-type device 82 is moved to the close position and the connection portions 54 and 55 are fixed on the fixing portions 868, respectively, the cover 40 is pushed down so that each of the locked portions 46 is moved downward to be away from the lock portion 28. As a result, the engagement between each of the engagement projections 282 and the corresponding engagement hole 462 is released. Thus, the lock portions 28 and the locked portions 46 of the present embodiment temporarily hold the cover 40 at the close position. More specifically, when the cover 40 is moved from the open position to the close position, the lock portions 28 lock the locked portions 46 and temporarily hold the cover 40 at the close position. The cover 40 is securely held at the close position when the connection portions 54 and 55 are fixed on the fixing portions 868, respectively.

According to the present embodiment, when the connection portions 54 provided on the locked portions 46 are fixed on the fixing portions 868, respectively, the locked portions 46 are apart from the lock portions 28, respectively. This structure prevents damage of the lock portions 28 and the locked portions 46 which might be caused due to the force of the locked portions 46 which pushes the lock portions 28. In addition, when the connection portions 54 and 55 are fixed on the fixing portions 868, respectively, the card-type device 82 is moved downward so as to push down the contact portions 78 (see FIG. 1) of the terminals 70. As a result, contact pressure between the electrodes (not shown) of the card-type device 82 and the contact portions 78 can be made high. However, the present invention is not limited thereto, but the connection portion may be provided on a part other than the locked portion 46.

Figure 5:
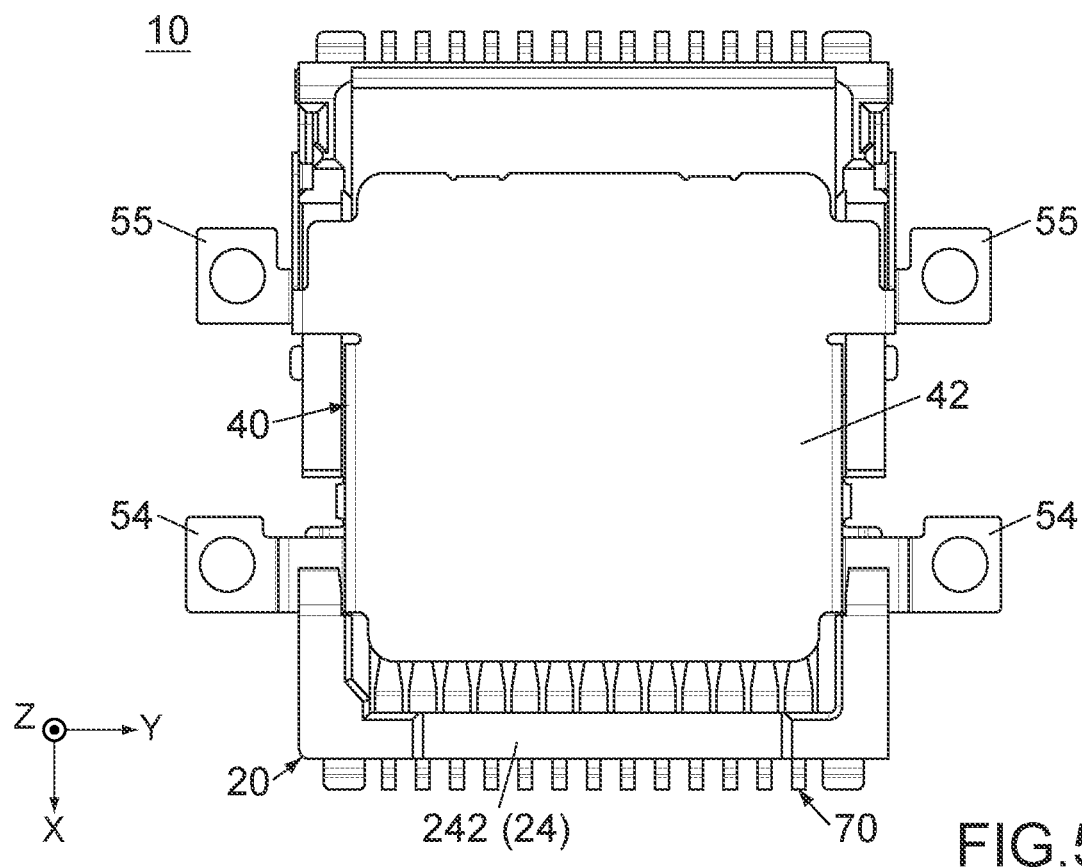
FIG. 5 is a top view showing the connector of FIG. 4.

Referring to FIG. 5, the cover 40 of the present embodiment has four of the connection portions 54 and 55. The four connection portions 54 and 55 are located at four corners of an imaginary rectangle in the XY-plane, respectively. Referring to FIG. 8, the thus-arranged four connection portions 54 and 55 are directly connected to the four fixing portions 868, or four parts of the circuit board 84, respectively, under the close state. This structure improves the heat transmission rate from the cover 40 to the circuit board 84. In addition, since the cover body 42 can be arranged to be in parallel to the circuit board 84, a load which is caused by the spring force of the terminals 70 and is applied to the hinge mechanism 60 can be reduced in well-balance.

However, the arrangement of the connection portions 54 and 55 of the present invention is not limited to the present embodiment but can be modified as necessary. Moreover, the number of the connection portions 54 and 55 of the present invention is not limited to four. The cover 40 may have one or more connection portions. Hereafter, explanation will be made about a modification of the connector 10 in which the number of the connection portion is one. The explanation will be made mainly about difference from the embodiment described above.

Figure 9:
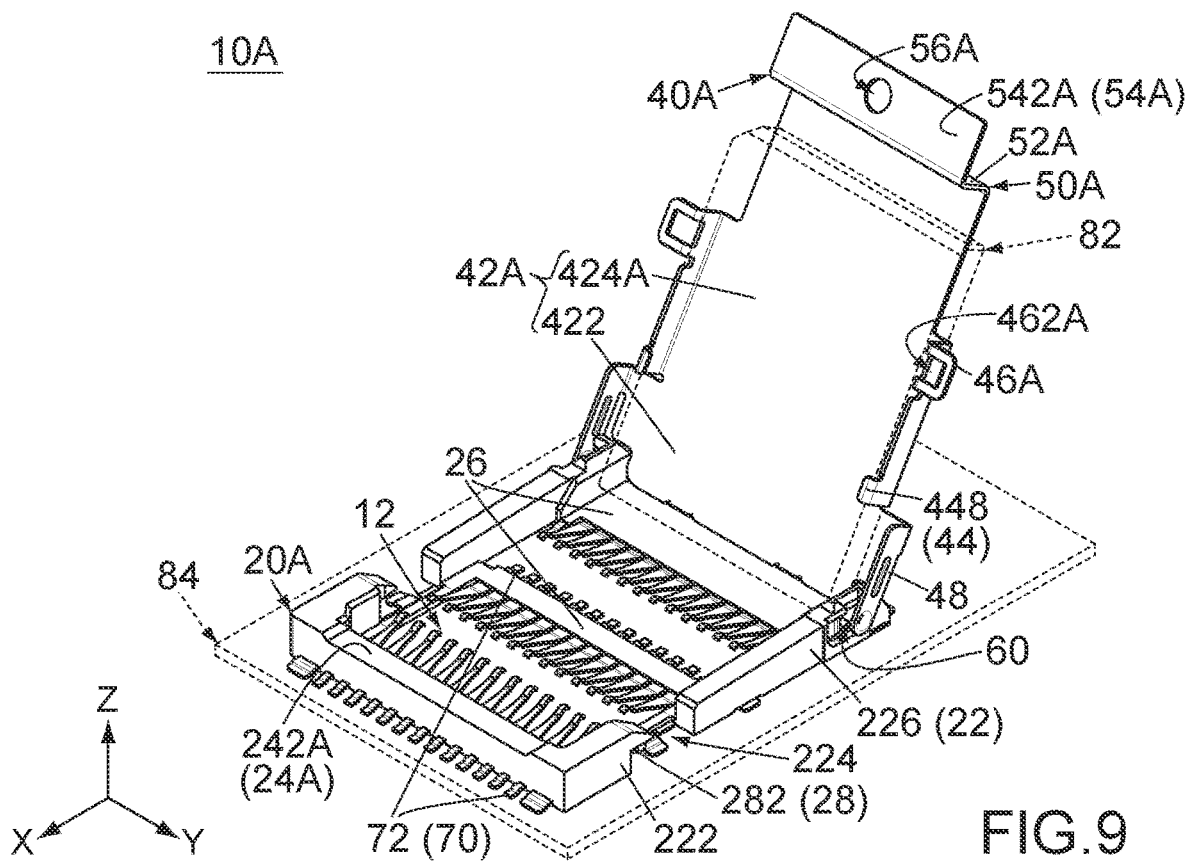
FIG. 9 is a perspective view showing a modification of the connector of FIG. 1, wherein a cover of the connector is located at an open position, and an outline of the card-type device and an outline of a part of the circuit board are illustrated with dashed line.

Comparing FIG. 9 with FIG. 1, a connector 10A according to the modification has a structure similar to that of the connector 10 and works similarly to the connector 10. For example, similarly to the connector 10, the connector 10A is mountable on the circuit board 84, and the card-type device 82 is accommodatable in the connector 10A. The connector 10A comprises a base 20A different from the base 20, a cover 40A different from the cover 40 and a plurality of the terminals 70 same as those of the connector 10. The base 20A is mainly made of insulator, and the cover 40A is formed of a metal plate. The terminals 70 are held by the base 20A.

The base 20A has a front wall 24A different from the front wall 24 of the base 20. The front wall 24A is formed with a recessed portion 242A. The recessed portion 242A is longer than the recessed portion 242 in the Y-direction. The base 20A has a structure same as that of the base 20 except for the difference described above.

The cover 40A has a cover body 42A different from the cover body 42 of the cover 40 and two locked portions 46A different from the locked portions 46 of the cover 40. The cover body 42A has the base portion 422 same as that of the cover body 42 and an extension portion 424A which extends longer than the extension portion 424 of the cover body 42. Each of the locked portions 46A is formed with an engagement hole 462A larger than the engagement hole 462 of the locked portion 46. Moreover, the cover 40A has a single heat-transmission portion 50A instead of the heat-transmission portions 50 and 51 of the cover 40. The heat-transmission portion 50A is provided on the extension portion 424A. The cover 40A has a structure same as that of the cover 40 except for the difference described above.

Figure 10:
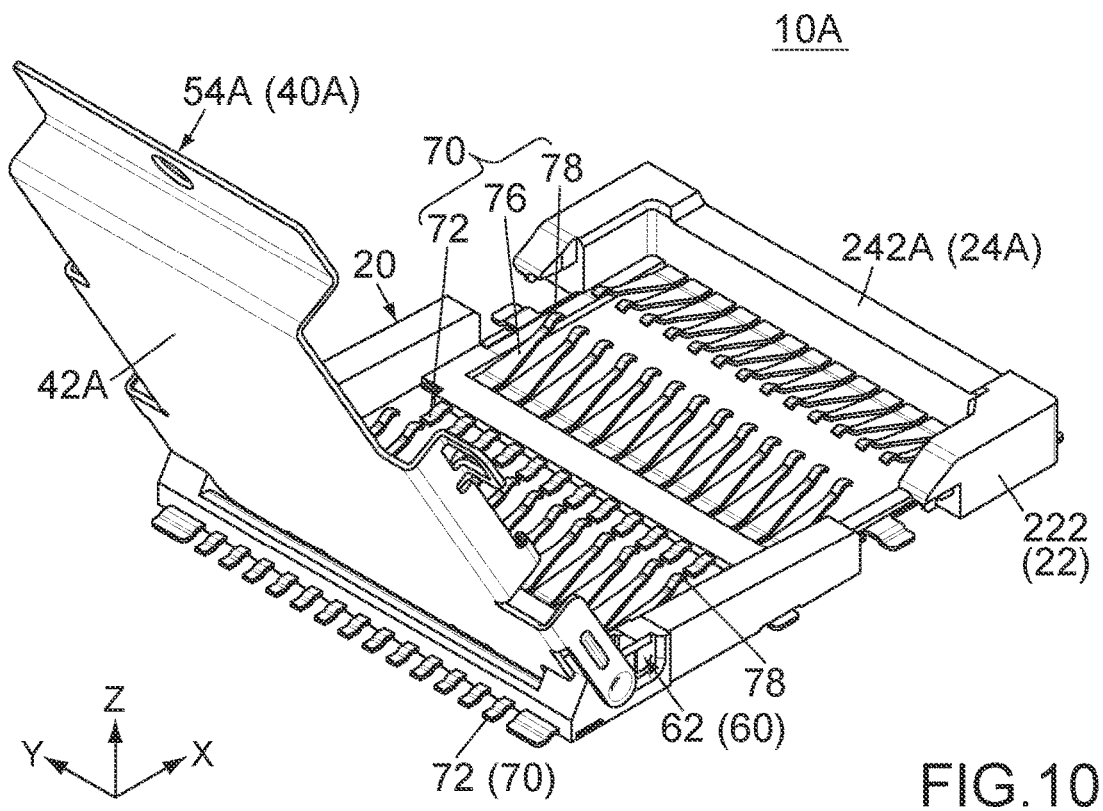
FIG. 10 is another perspective view showing the connector of FIG. 9.
Figure 11:
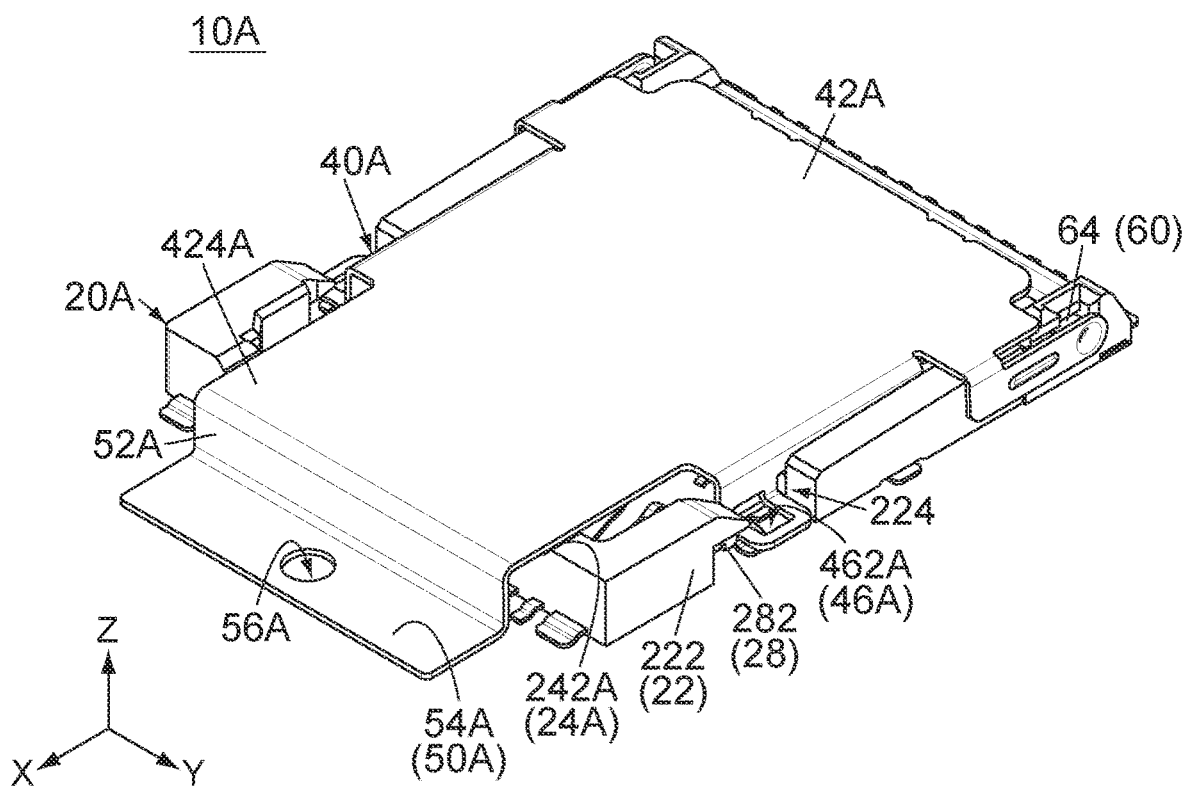
FIG. 11 is a perspective view showing the connector of FIG. 9, wherein the cover is located at an intermediate position and holds the card-type device.
Figure 12:
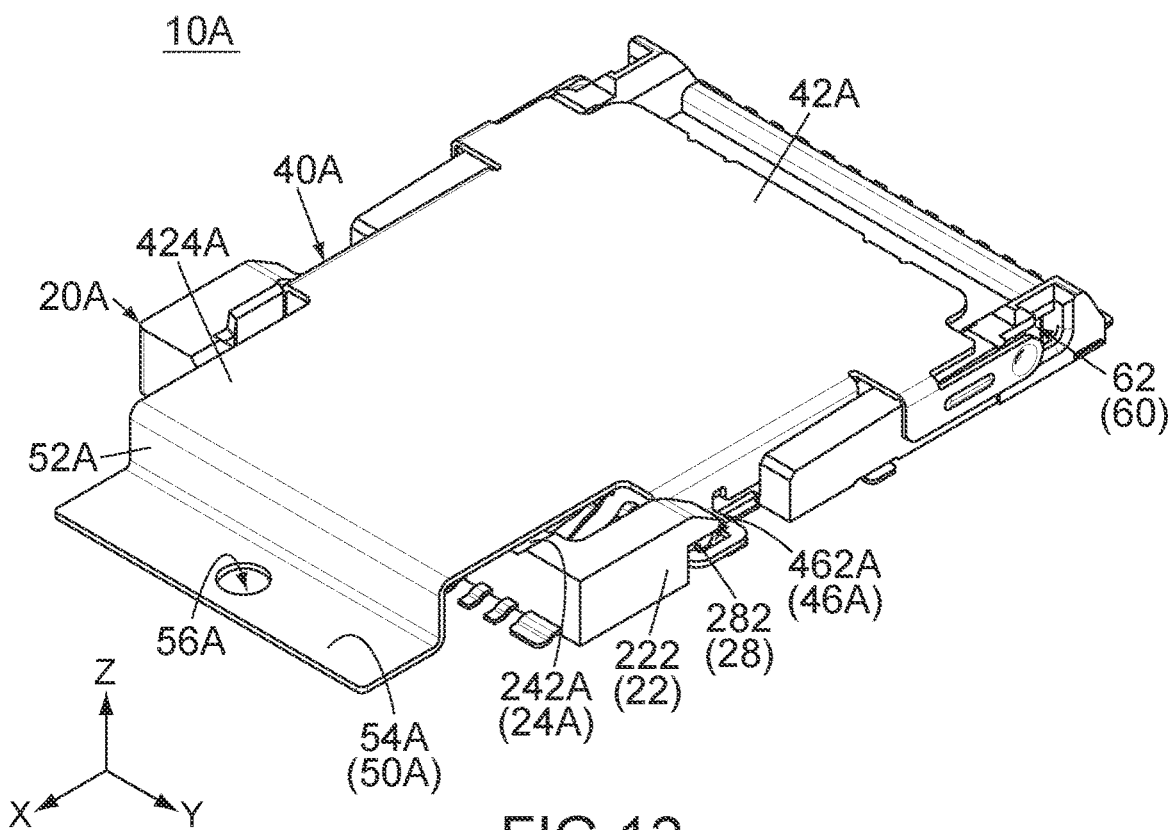
FIG. 12 is a perspective view showing the connector of FIG. 11, wherein the cover is located at a close position and holds the card-type device.

Referring to FIGS. 10 to 12, the cover 40A is attached to the base 20A via the hinge mechanism 60 same as that of the connector 10 (see FIG. 1) to be openable and closable. Thus, the cover 40A is movable between an open position of FIG. 10 at which the cover 40A is opened relative to the base 20A and a close position of FIG. 12 at which the cover 40A is closed relative to the base 20A via an intermediate position of FIG. 11. When the cover 40A is moved from the open position to the close position, the lock portions 28 lock the locked portions 46A and temporarily hold the cover 40A at the close position similarly to the connector 10. However, each of the locked portions 46A of the cover 40A is provided with no connection portion.

As shown in FIG. 9, the heat-transmission portion 50A has a coupling portion 52A and a connection portion 54A. The heat-transmission portion 50A is located on the cover 40A at a position opposite to the position of the hinge mechanism 60. In detail, the coupling portion 52A is connected to an edge of the extension portion 424A and extends to be away from the cover body 42A. The connection portion 54A is connected to the coupling portion 52A. The connection portion 54A is a metal piece having a rectangular shape and extends in parallel to the cover body 42A. Thus, the connection portion 54A has a connection surface 542A which extends in parallel to the cover body 42A. The connection portion 54A is formed with a passing hole 56A. The passing hole 56A passes through the connection surface 542A. As described above, the cover 40A of the connector 10A has the only one connection portion 54A.

Figure 13:
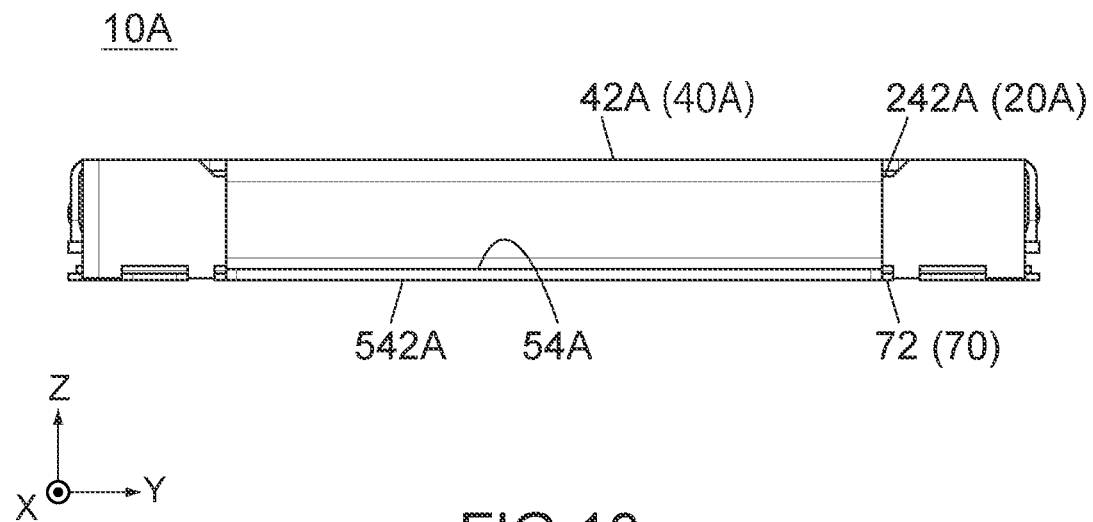
FIG. 13 is a front view showing the connector of FIG. 12.

Referring to FIGS. 11 and 12, when the cover 40A is located either at the intermediate position of FIG. 11 or the close position of FIG. 12, the extension portion 424A of the cover body 42A is partially received in the recessed portion 242A of the base 20A. At that time, the passing hole 56A passes through the connection surface 542A in the Z-direction. Referring to FIG. 13, the connection surface 542A at that time is a lower surface of the connection portion 54A and extends in parallel to the XY-plane.

Figure 14:
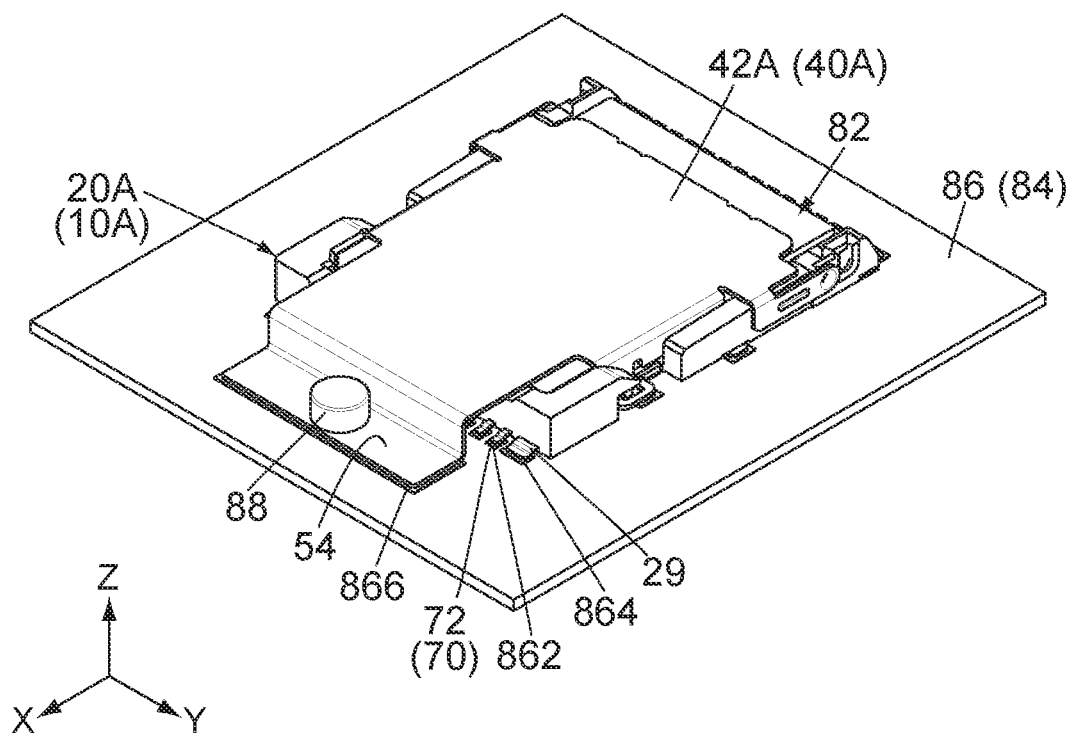
FIG. 14 is another perspective view showing the connector of FIG. 12, wherein the connector accommodates the card-type device, and a connection portion of the cover is screwed to the circuit board.
Figure 15:
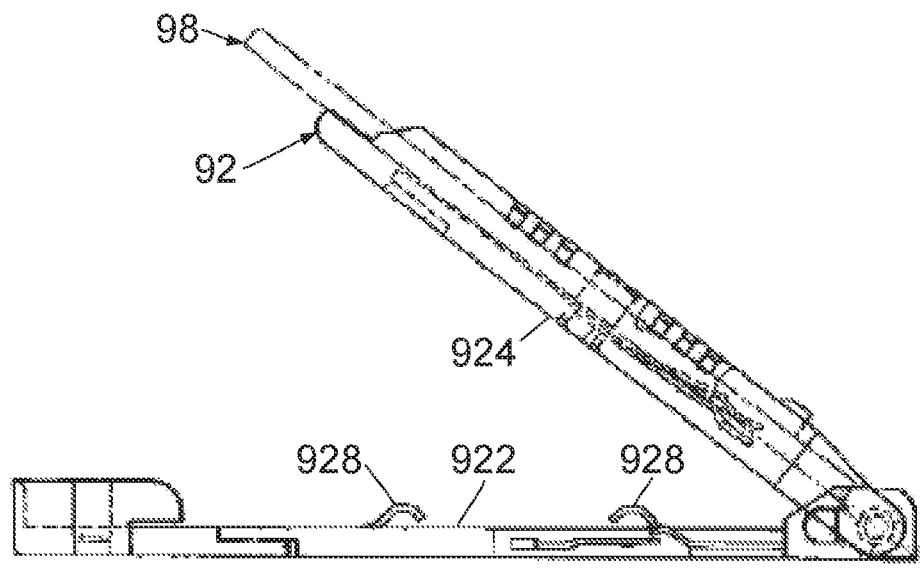
FIG. 15 is a view showing a connector of Patent Document 1, wherein a cover of the connector is opened.
Figure 16:
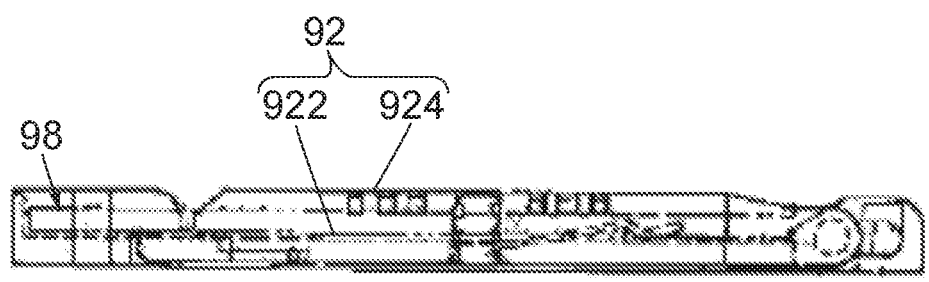
FIG. 16 is a view showing the connector of FIG. 15, wherein the cover of the connector is closed.

Referring to FIG. 14, the connection portion 54A is screwed to the circuit board 84 by the screw 88 under a close state where the connector 10A is mounted on the circuit board 84 and the cover 40A is closed relative to the base 20A. Thus, the connection portion 54A is directly connected to the circuit board 84 under the close state. The connection surface 542A is in surface contact with the circuit board 84, specifically with the fixing portion 868, under the close state. According to the present modification, the cover 40A which covers the card-type device 82 is directly connected to the circuit board 84 and thereby works as an efficient heat transmission path which discharges the heat generated in the card-type device 82 to the circuit board 84. Similarly to the previously described embodiment, the present modification provides the connector 10A which can effectively discharge the heat generated in the card-type device 82 to the outside of the connector 10A.

According to the present modification, the one connection portion 54A is fixed on the fixing portion 868, or one part of the circuit board 84. This structure, in which the cover 40A is fixed to only one position of the circuit board 84, improves heat transmission rate from the cover 40A to the circuit board 84 while a relatively small area of the circuit board 84 is used.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector which is mountable on a circuit board and in which a card-type device is accommodatable, wherein:
the circuit board has a mounting surface on which the connector is mountable;

the connector comprises a base, a cover and a terminal;
the cover is attached to the base to be operable and closable;
the terminal is held by the base;
the cover has one or more connection portions; and
the connection portion is directly connected to the mounting surface of the circuit board under a close state where the connector is mounted on the circuit board and the cover is closed relative to the base.

2. The connector as recited in claim 1, wherein:
the cover is movable between an open position at which the cover is opened relative to the base and a close position at which the cover is closed relative to the base;
the base has a lock portion;
the cover has a locked portion;
when the cover is moved from the open position to the close position, the lock portion locks the locked portion and temporarily holds the cover at the close position; and
the locked portion is provided with the connection portion.

3. The connector as recited in claim 1, wherein:
the cover has four of the connection portions; and
the four connection portions are directly connected to four parts of the circuit board, respectively, under the close state.

4. The connector as recited in claim 1, wherein the one or more connection portions consist of only one connection portion.

5. The connector as recited in claim 1, wherein:
each of the connection portions has a connection surface; and
each of the connection surfaces is in surface contact with the circuit board under the close state.

6. The connector as recited in claim 5, wherein:
each of the connection portions is formed with a passing hole;
the passing holes pass through the connection surfaces, respectively; and each of the connection portions is screwed to the circuit board under the close state.

* * * * *